(12) United States Patent
Sato

(10) Patent No.: US 10,991,415 B2
(45) Date of Patent: Apr. 27, 2021

(54) SEMICONDUCTOR DEVICE PERFORMING IMPLICIT PRECHARGE OPERATION

(71) Applicant: MICRON TECHNOLOGY, INC., Boise, ID (US)

(72) Inventor: Homare Sato, Sagamihara (JP)

(73) Assignee: Micron Tehcnology, Inc., Boise, ID (US)

(*) Notice: Subject to any disclaimer, the term of this patent is extended or adjusted under 35 U.S.C. 154(b) by 43 days.

(21) Appl. No.: 16/576,621

(22) Filed: Sep. 19, 2019

(65) Prior Publication Data

US 2021/0090634 A1 Mar. 25, 2021

(51) Int. Cl.
*G11C 7/10* (2006.01)
*G11C 11/4076* (2006.01)
*H01L 25/065* (2006.01)
*G11C 11/408* (2006.01)

(52) U.S. Cl.
CPC ...... *G11C 11/4076* (2013.01); *H01L 25/0657* (2013.01); *G11C 11/4087* (2013.01); *H01L 2225/06541* (2013.01)

(58) Field of Classification Search
CPC ............ G11C 11/4076; G11C 11/4087; H01L 25/0657; H01L 2225/06541
See application file for complete search history.

(56) References Cited

U.S. PATENT DOCUMENTS

| 8,659,928 | B1* | 2/2014 | Stephens, Jr. | G11C 5/04 365/63 |
| 8,737,160 | B2* | 5/2014 | Hayashi | G11C 11/4082 365/233.1 |
| 2018/0341575 | A1* | 11/2018 | Narui | G11C 5/04 |
| 2020/0303030 | A1* | 9/2020 | Lee | G11C 8/06 |

* cited by examiner

*Primary Examiner* — Toan K Le
(74) *Attorney, Agent, or Firm* — Dorsey & Whitney LLP

(57) ABSTRACT

Disclosed herein is an apparatus that includes a first semiconductor chip having a latency counter supplied with a first command and configured to generate a second command when a predetermined period is elapsed after the first command is activated; and a second semiconductor chip having an active control circuit configured to activate a state signal in response to the first command when the state signal is in an inactive state, deactivate the state signal in response to the first command when the state signal is in an active state, and activate the state signal in response to the second command generated based on the first command that is activated when the state signal is in the active state.

20 Claims, 7 Drawing Sheets

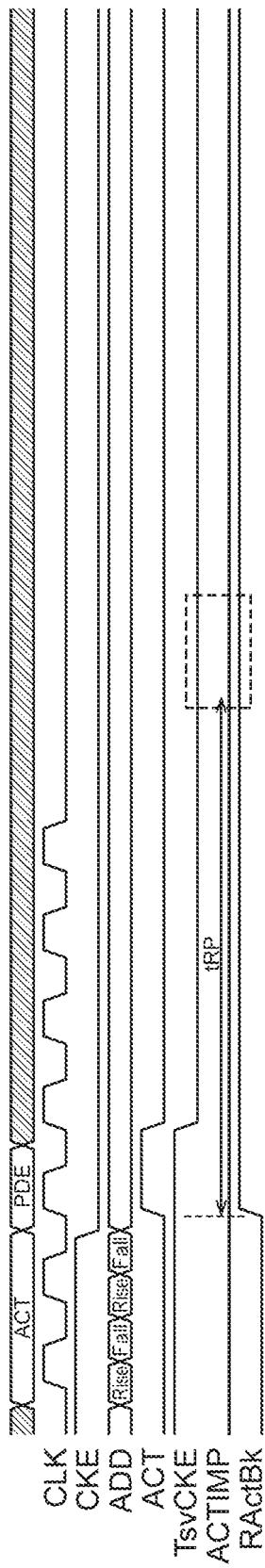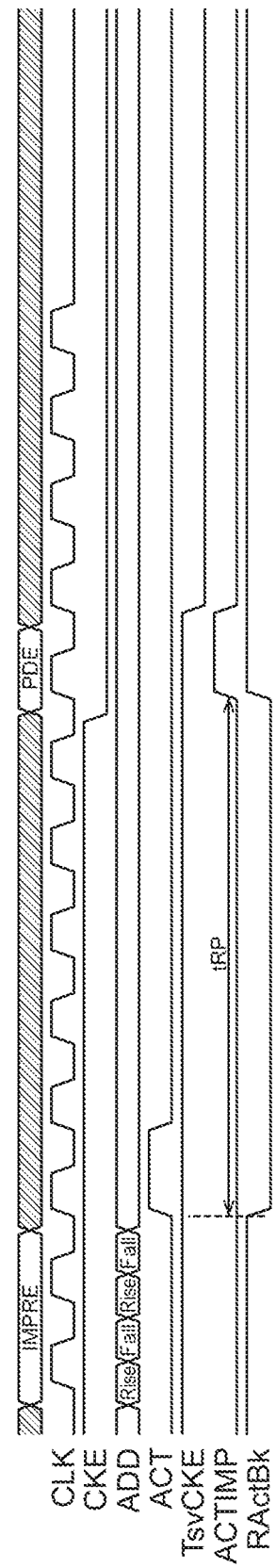

SEMICONDUCTOR DEVICE PERFORMING IMPLICIT PRECHARGE OPERATION

BACKGROUND

In a DRAM (Dynamic Random Access Memory), an operation called "Implicit Precharge" is sometimes performed. The implicit precharge is an operation of issuing an active command again to a memory bank that is in an active state to change the memory bank in the active state to an inactive state (a precharge state) and then generating an internal command after a predetermined period is elapsed, thereby changing the memory bank to the active state again. Accordingly, a latency counter for generating an internal command after the predetermined time is elapsed from issuance of an active command is required to realize the implicit precharge operation. When the implicit precharge is to be realized in a memory device including an interface chip and memory core chips, such as an HBM (High Bandwidth Memory), there is a problem that a clock signal for operating the latency counter needs to be supplied from the interface chip to the memory core chips and current consumption increases if the latency counter is placed on the memory core chips.

BRIEF DESCRIPTION OF THE DRAWINGS

FIG. 5 and FIG. 6A to 6D are waveform charts for explaining an operation of the active control circuit.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structural, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
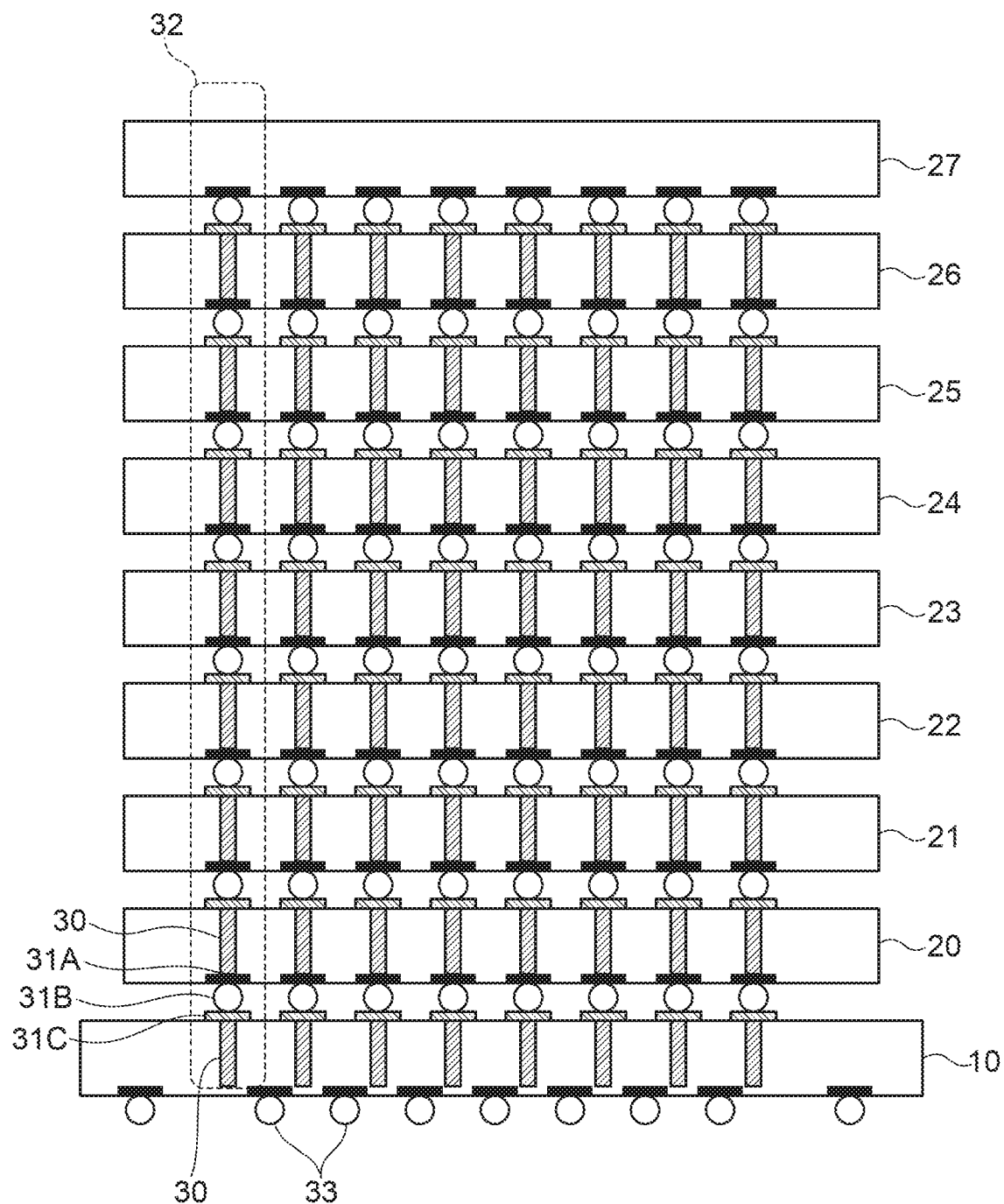
FIG. 1 is a schematic diagram showing a configuration of a semiconductor device according to the present disclosure.

A semiconductor device shown in FIG. 1 is an HBM having a structure in which eight memory core chips 20 to 27 are stacked one on top of another on an interface chip 10. However, subject matters of the present invention are not limited to the HBM. The memory core chips 20 to 27 are semiconductor chips on each of which a memory core including a memory cell array is integrated. The interface chip 10 is a semiconductor chip that controls the memory core chips 20 to 27. Each of the interface chip 10 and the memory core chips 20 to 26 includes a plurality of TSVs 30 provided to penetrate through the corresponding semiconductor substrate. The interface chip 10 and the memory core chips 20 to 27 are all stacked by a face-down method, that is, in such a manner that principal surfaces on which transistors and wiring patterns (all not shown) are formed face downward. Accordingly, the memory core chip 27 located in the topmost layer does not need the TSVs 30. However, the memory core chip 27 located in the topmost layer may include the TSVs 30. Most of the TSVs 30 provided on the memory core chips 20 to 26 are connected to front TSV pads 31A located at same planar positions, respectively. In contrast thereto, most of the TSVs 30 provided on the interface chip 10 and the front TSV pads 31A provided on the interface chip 10 are located at different planar positions. The TSVs 30 located at the same planar positions among the TSVs 30 provided on the interface chip 10 and the memory core chips 20 to 26 are cascade connected via the front TSV pads 31A, TSV bumps 31B, and back TSV pads 31C, respectively, so that a plurality of signal paths 32 are formed. Commands and write data output from the interface chip 10 are supplied to the memory core chips 20 to 27 via the signal paths 32. Read data output from the memory core chips 20 to 27 are supplied to the interface chip 10 via the signal paths 32. External terminals 33 are provided on the interface chip 10 and transmission/reception of signals to/from an external circuit is performed via the external terminals 33.

Figure 2:
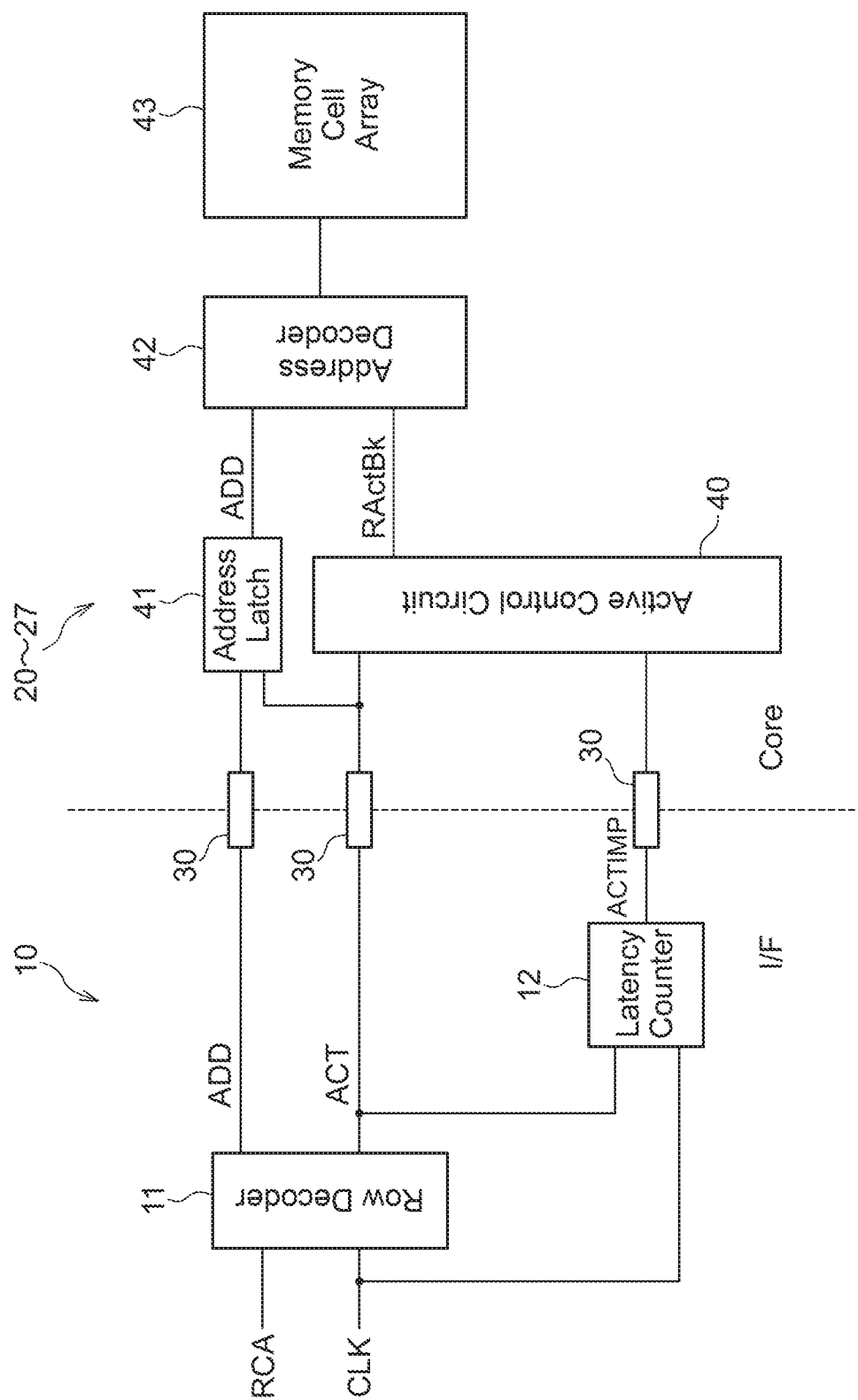
FIG. 2 is a block diagram showing a configuration of relevant parts of the semiconductor device according to the present disclosure.

As shown in FIG. 2, the interface chip 10 includes a row decoder 11 and a latency counter 12. The row decoder 11 receives a command address signal RCA and a clock signal CLK and generates an address signal ADD and an internal command. One type of the internal command is an active command ACT. The active command ACT is supplied to the memory core chips 20 to 27 via the TSVs 30 and is supplied also to the latency counter 12. The address signal ADD is also supplied to the memory core chips 20 to 27 via the TSVs 30. The address signal ADD may be divided and supplied to the memory core chips 20 to 27 in plural times. The latency counter 12 receives the active command ACT and the clock signal CLK. The latency counter 12 generates an internal command ACTIMP after a predetermined cycle of the clock signal CLK is elapsed from activation of the active command ACT. The internal command ACTIMP is supplied to the memory core chips 20 to 27 via different TSVs 30.

Each of the memory core chips 20 to 27 includes an active control circuit 40, an address latch circuit 41, an address decoder 42, and a memory cell array 43. The active control circuit 40 receives the active command ACT and the internal command ACTIMP and generates a state signal RActBk. The state signal RActBk is a signal indicating the state of the memory cell array 43 and is at a high level when the memory cell array 43 is in an active state while being at a low level when the memory cell array 43 is in an inactive state (a precharge state). The state signal RActBk is supplied to the address decoder 42 along with the address signal ADD latched by the address latch circuit 41. The address decoder 42 decodes the address signal ADD and performs a row access to the memory cell array 43. The memory cell array 43 may be divided into a plurality of memory banks. In this case, the active control circuit 40 is allocated to each of the memory banks.

Figure 3:
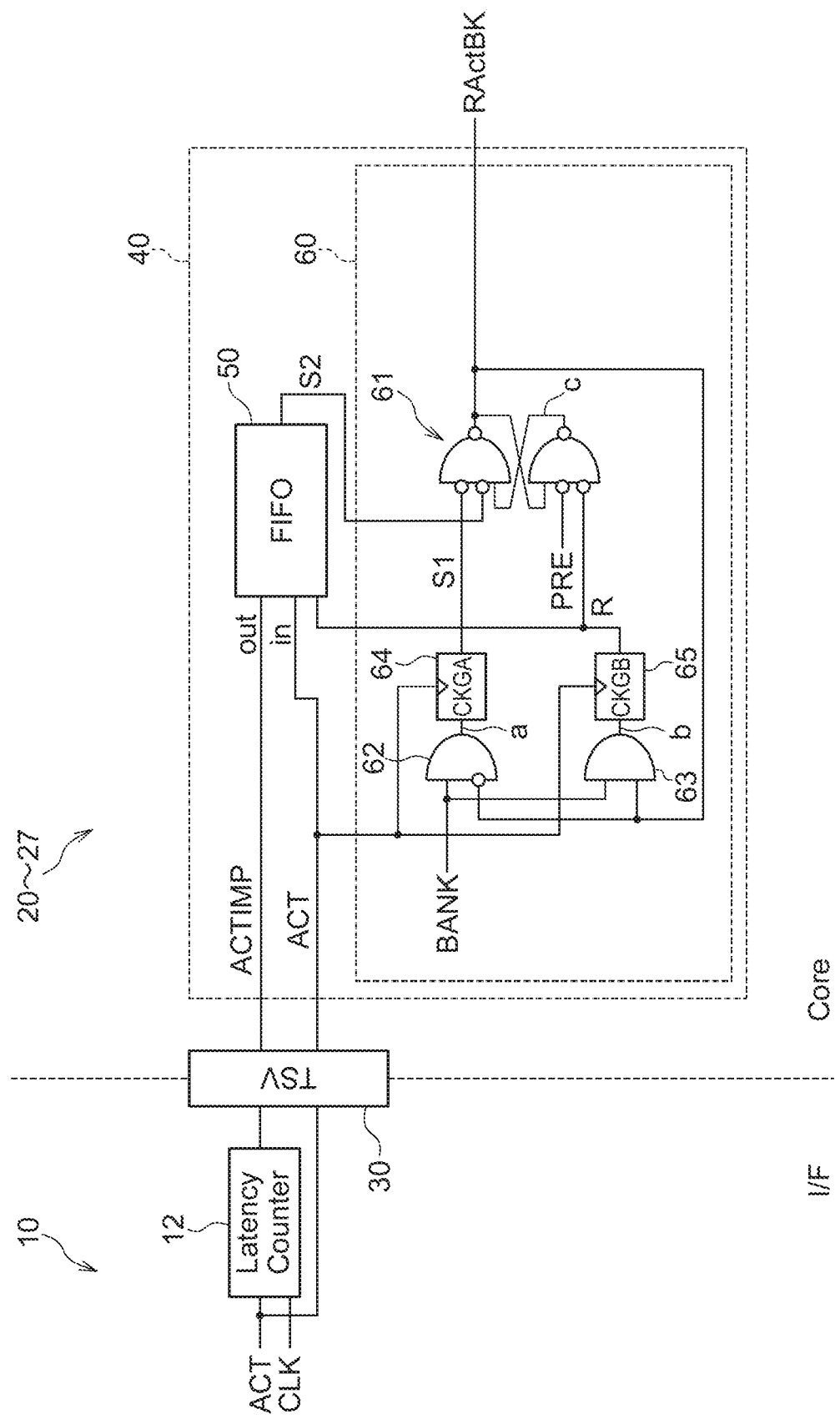
FIG. 3 is a circuit diagram of an active control circuit shown in FIG. 2.

As shown in FIG. 3, the active control circuit 40 includes a FIFO circuit 50 and a state circuit 60. The state circuit 60 includes an SR latch circuit 61, AND gate circuits 62 and 63, and clock gate circuits 64 and 65. The SR latch circuit 61 is set in response to a set signal S1 or S2 and is reset in response to a reset signal R or a precharge command PRE. The precharge command PRE is one type of the internal command generated by the row decoder 11. The state signal RActBk is activated to a high level when the SR latch circuit 61 is set, and the state signal RActBk is deactivated to a low level when the SR latch circuit 61 is reset. The AND gate circuits 62 and 63 receive a bank select signal BANK and the state signal RActBk and generate internal signals a and b, respectively. Because an inverted signal of the state signal RActBk is input to the AND gate circuit 62, the internal signal a is activated when the state signal RActBk is at a low level, that is, the memory cell array 43 is in the precharge state. On the other hand, the state signal RActBk is input as it is to the AND gate circuit 63. Therefore, the internal signal b is activated when the state signal RActBk is at a high level, that is, when the memory cell array 43 is in the active state. The internal signals a and b are supplied to the clock gate circuits 64 and 65, respectively. The clock gate circuits 64 and 65 allow the internal signals a and b to pass, respectively, during a period in which the active command ACT is activated. The internal signal a having passed through the clock gate circuit 64 is the set signal S1. The internal signal b having passed through the clock gate circuit 65 is the reset signal R. The reset signal R is supplied also to the FIFO circuit 50. The FIFO circuit 50 latches the reset signal R in response to the active command ACT and outputs the latched reset signal R in response to the internal command ACTIMP. The reset signal R output from the FIFO circuit 50 is used as the set signal S2.

Figure 4:
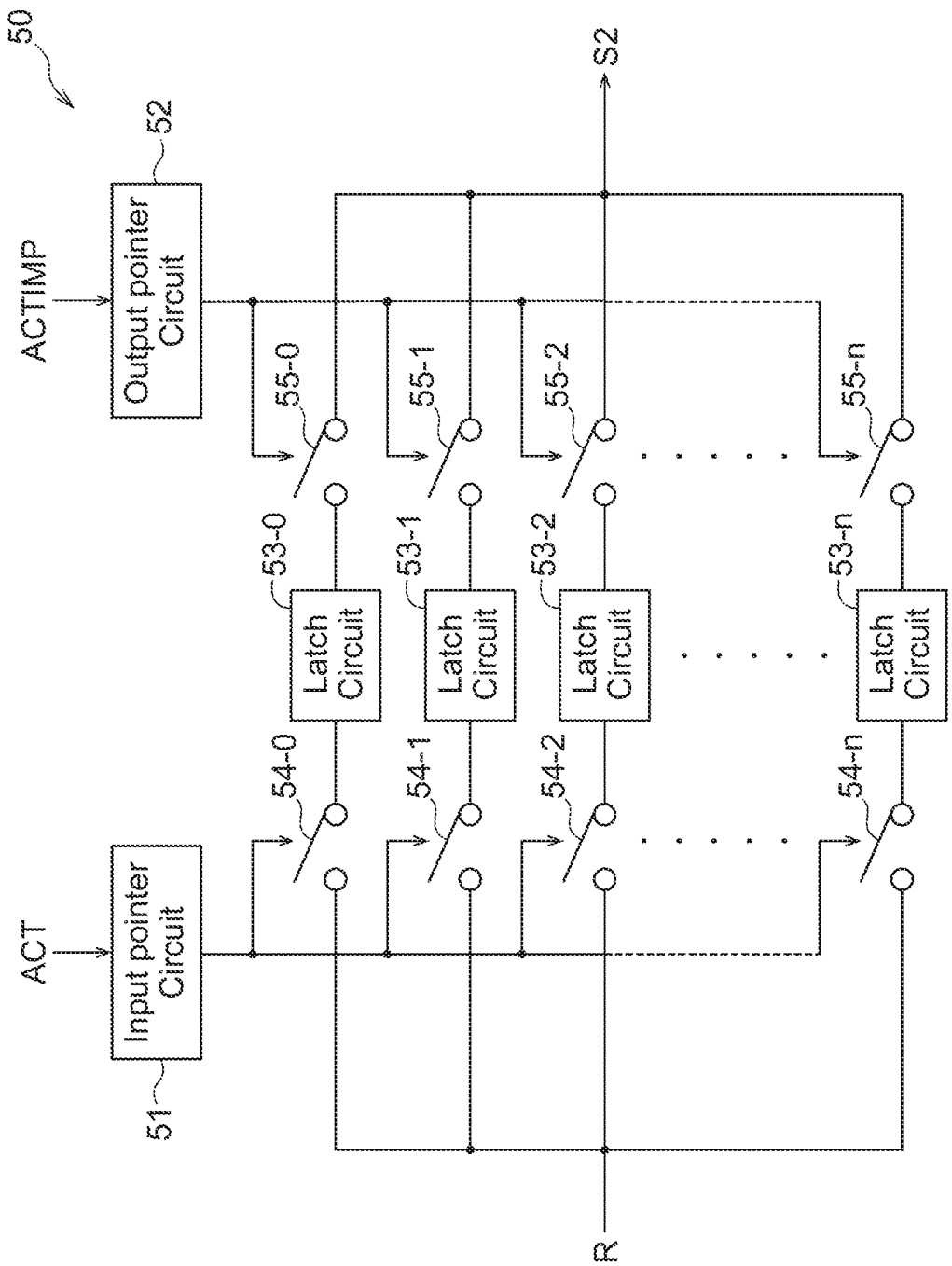
FIG. 4 is a circuit diagram of a FIFO circuit shown in FIG. 3.

As shown in FIG. 4, the FIFO circuit 50 is a point-shift FIFO circuit including an input pointer circuit 51 and an output pointer circuit 52. An input point value output from the input pointer circuit 51 is supplied to switch circuits 54-0 to 54-n. One of the switch circuits 54-0 to 54-n is brought into conduction according to the input point value. The input pointer circuit 51 updates the input point value each time the active command ACT is activated. An output point value output from the output pointer circuit 52 is supplied to switch circuits 55-0 to 55-n. One of the switch circuits 55-0 to 55-n is brought into conduction according to the output point value. The output pointer circuit 52 updates the output point value each time the internal command ACTIMP is activated. The FIFO circuit 50 includes latch circuits 53-0 to 53-n corresponding to the switch circuits 54-0 to 54-n and the switch circuits 55-0 to 55-n, respectively. Accordingly, the reset signal R input to the FIFO circuit 50 is latched by one of the latch circuits 53-0 to 53-n via a conducting one of the switch circuits 54-0 to 54-n. The reset signal R latched by one of the latch circuits 53-0 to 53-n is output as the set signal S2 via a conducting one of the switch circuits 55-0 to 55-n.

An operation of the active control circuit 40 is explained next. In an example shown in FIG. 5, an active command is externally issued with designation of a memory bank BAa at each of times t1 and t2, and active commands are externally issued with designation of memory banks BAb to BAd at times t3 to t5, respectively. When an active command is issued at the time t1, the memory bank BAa is in the precharge state. In contrast thereto, when an active command is issued at the time t2, the memory bank BAa is in the active state. Accordingly, when the active command is issued at the time t2, an implicit precharge operation is performed.

First, when an active command is issued at the time t1, the row decoder 11 shown in FIG. 2 activates the active command ACT. Because the state signal RActBk is at a low level at this point of time, the internal signal a is at a high level and the internal signal b is at a low level. When the active command ACT is activated in this state, the set signal S1 is activated. The reset signal R is not activated. Accordingly, the reset signal R at an inactive level is latched by a predetermined latch circuit in the FIFO circuit 50. When the set signal S1 is activated, the SR latch circuit 61 is set and the state signal RActBk changes to a high level. Therefore, the memory bank BAa transitions from the precharge state to the active state. Further, the internal signal a changes to a low level and the internal signal b changes to a high level. Practically an active command externally issued is activated for a two-clock cycle as shown in FIG. 6A and the address signal ADD is divided and transferred in four times in synchronization with rising edges and falling edges of the clock signal CLK, respectively during that period.

Next, when an active command is issued again at the time t2 with designation of the memory bank BAa, the row decoder 11 shown in FIG. 2 activates the active command ACT again. At this point of time, the state signal RActBk is at a high level, the internal signal a is at a low level, and the internal signal b is at a high level. When the active command ACT is activated in this state, the reset signal R is activated. Accordingly, the reset signal R at an active level is latched by a predetermined latch circuit in the FIFO circuit 50. The set signal S1 is not activated. When the reset signal R is activated, the SR latch circuit 61 is reset and the state signal RActBk changes to a low level. Accordingly, the memory bank BAa transitions from the active state to the precharge state. Further, the internal signal a changes to a high level and the internal signal b changes to a low level. In FIG. 6B, a second active command is denoted by IMPRE. Thereafter, when an active command is issued at the time t3 with designation of the memory bank BAb, the bank select signal BANK changes to a low level and accordingly the internal signal a also changes to a low level.

Figure 5:
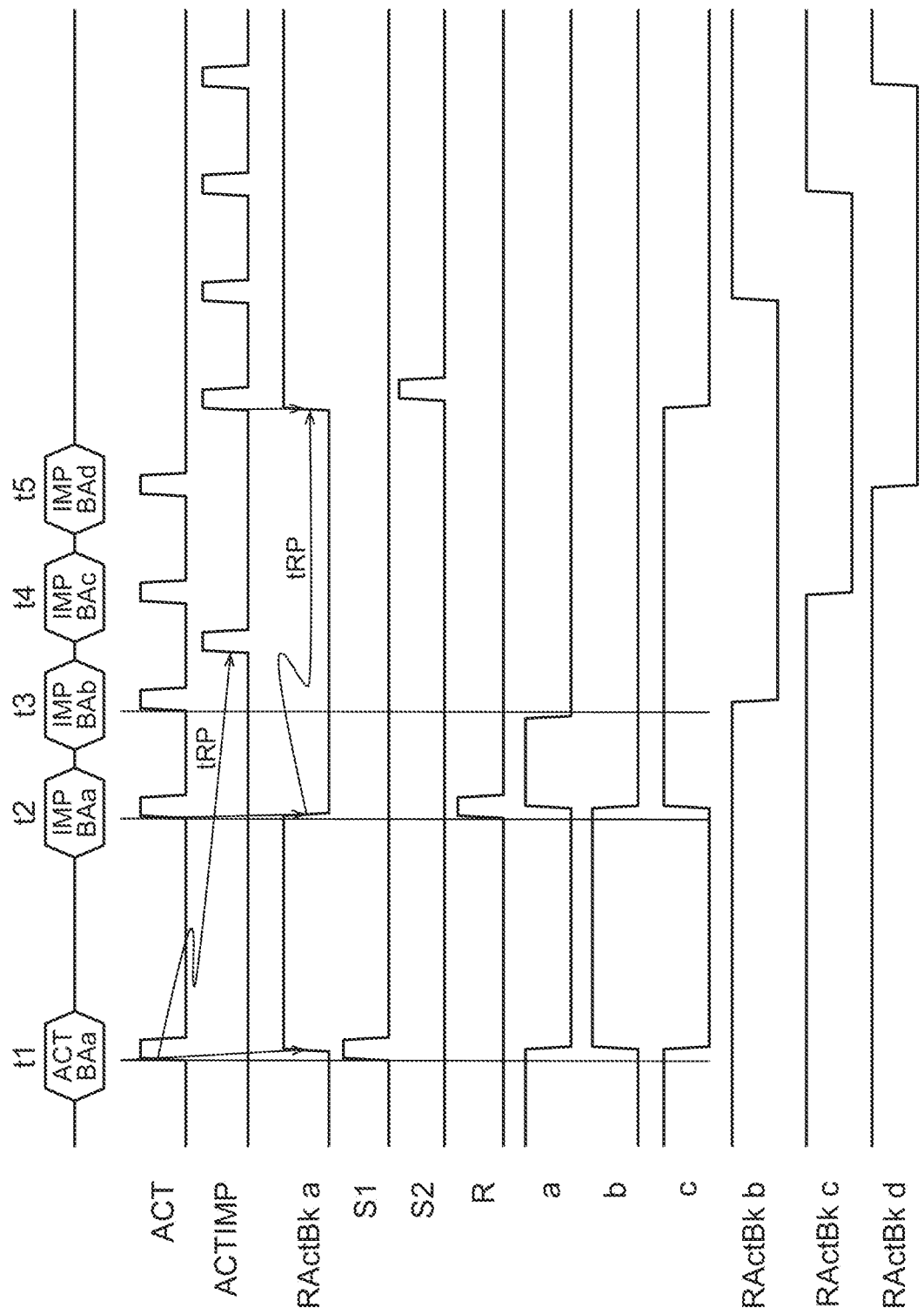
Figure 6A:
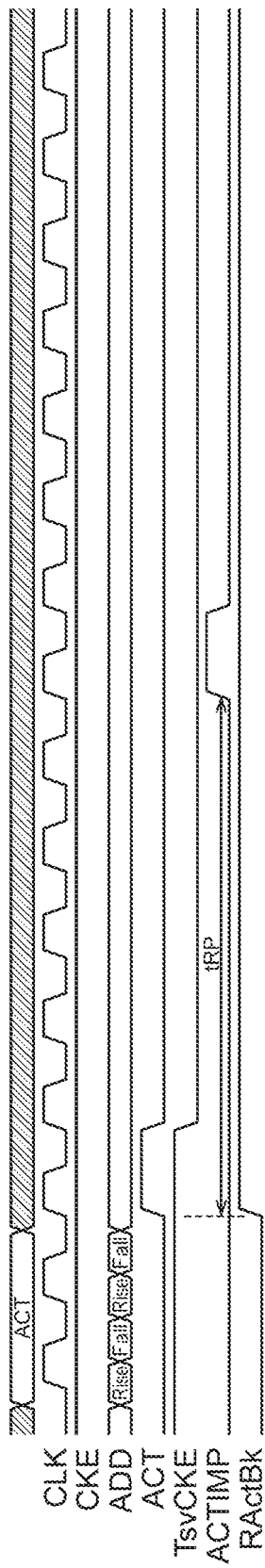
Figure 6B:
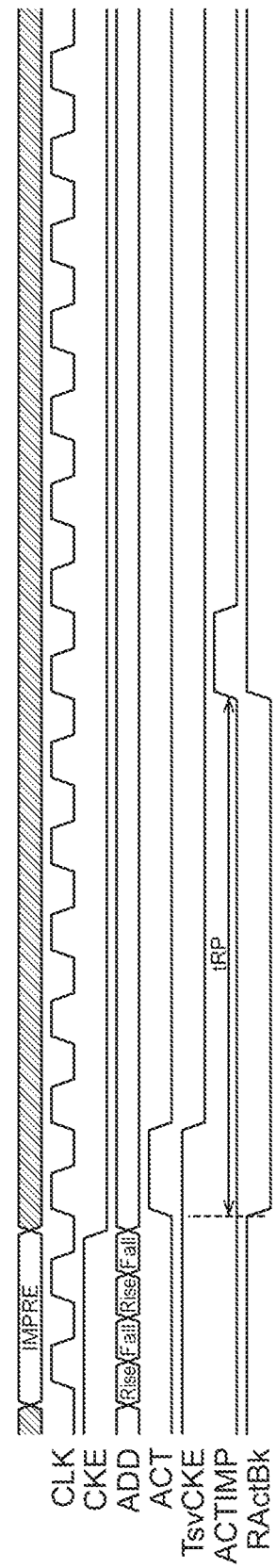

When a predetermined period tRP is elapsed from the time t1, the latency counter 12 shown in FIG. 2 activates the internal command ACTIMP (see FIGS. 5 and 6A). Accordingly, the reset signal R latched at the time t1 is output from the FIFO circuit 50 as the set signal S2. However, because the reset signal R latched at the time t1 is at an inactive level as described above, the set signal S2 is not activated. Meanwhile, when the predetermined period tRP is elapsed from the time t2, the latency counter 12 activates the internal command ACTIMP (see FIGS. 5 and 6B). Accordingly, the reset signal R latched at the time t2 is output from the FIFO circuit 50 as the set signal S2. Because the reset signal R latched at the time t2 is at an active level as described above, the set signal S2 is activated. When the set signal S2 is activated, the SR latch circuit 61 is set and the state signal RActBk changes to a high level. Therefore, the memory bank BAa transitions from the precharge state to the active state. In this way when an active command is externally issued again to a memory bank in the active state, the implicit precharge operation is performed. The implicit precharge operation is performed also to the memory banks BAb to BAd in response to active commands issued at the times t3 to t5, respectively.

As described above, the semiconductor device according to the present disclosure has the latency counter 12 that generates the internal command ACTIMP, which is placed on the interface chip 10. Therefore, there is no need to supply a clock signal for operating a latency counter from an interface chip to memory core chips. Accordingly, the current consumption can be reduced as compared to a case where the latency counter 12 is placed on the memory core chips 20 to 27. Furthermore, because the state circuit 60 that determines whether each of the memory banks is in the active state is provided on each of the memory core chips 20 to 27, the state circuit 60 does not need to be placed on the interface chip 10.

If a power down command is issued immediately after an active command is externally issued as shown in FIG. 6C, the clock signal CLK is stopped, so that the count operation of the latency counter 12 stops and the internal command ACTIMP is not generated. In this case, the relation between the input point value and the output point value becomes incorrect. To prevent this situation, the latency counter 12 and the FIFO circuit 50 are reset to an initial state. Further, to enter a power down mode after an active command (MIRE) for performing the implicit precharge operation is issued as shown in FIG. 6D, it suffices to issue a power down command after the internal command ACTIMP is generated.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. An apparatus comprising:
    a first semiconductor chip having a latency counter supplied with a first command and configured to generate a second command when a predetermined period is elapsed after the first command is activated; and
    a second semiconductor chip having an active control circuit configured to activate a state signal in response to the first command when the state signal is in an inactive state, deactivate the state signal in response to the first command when the state signal is in an active state, and activate the state signal in response to the second command generated based on the first command that is activated when the state signal is in the active state.

2. The apparatus of claim 1,
    wherein the second, semiconductor chip further has a memory cell array,
    wherein the state signal is in the active state when the memory cell array is activated, and
    wherein the state signal is in the inactive state when the memory cell array is deactivated.

3. The apparatus of claim 1, wherein the first and second semiconductor chips are stacked to each other.

4. The apparatus of claim 3, wherein the first and second commands are transferred from the first semiconductor chip to the second semiconductor chip via TSVs penetrating through at least one of the first and second semiconductor chips.

5. The apparatus of claim 1,
    wherein the latency counter is configured to operate in synchronous with a clock signal, and
    wherein the second semiconductor chip is free from the clock signal.

6. The apparatus of claim 1,
    wherein the active control circuit includes a SR latch circuit configured to output the state signal, and
    wherein the SR latch circuit is configured to be set in response to the first command when the SR latch circuit is in a reset state, and be reset in response to the first command when the SR latch circuit is in a set state.

7. The apparatus of claim 6, wherein the SR latch circuit is configured to be reset in response to a third command supplied from the first semiconductor chip to the second semiconductor chip.

8. The apparatus of claim 6,
    wherein the active control circuit further includes a first gate circuit configured to activate a first set signal in response to the first command when the SR latch circuit is in the reset state, and a second gate circuit configured to activate a reset signal in response to the first command when the SR latch circuit is in the set state, and
    wherein the SR latch circuit is configured to be set by the first set signal and be reset by the reset signal.

9. The apparatus of claim 8,
    wherein the active control circuit further includes a FIFO circuit configured to store the reset signal in response to the first command and output the reset signal stored therein as a second set signal in response to the second command, and
    wherein the SR latch circuit is configured to be set by the second set signal.

10. The apparatus of claim 9,
    wherein the latency counter is configured to operate in synchronous with a clock signal, and
    wherein the latency counter and the FIFO circuit are configured to be reset to an initial state when the clock signal is stopped.

11. The apparatus of claim 10, wherein the clock signal is stopped during a power down mode.

12. An apparatus comprising:
    a memory cell array, and
    an active control circuit configured to activate and deactivate the memory cell array,
    wherein the active control circuit is configured to activate the memory cell array in response to a first command when the memory cell array is deactivated, deactivate the memory cell array in response to the first command when the memory cell array is activated, keep a current state of the memory cell array in response to a second command when the memory cell array is activated, and activate the memory cell array in response to the second command when the memory cell array is deactivated.

13. The apparatus of claim 12, wherein the second command is activated after the first command is activated.

14. The apparatus of claim 13, wherein the second command is activated when a predetermined period is elapsed after the first command is activated.

15. The apparatus of claim 14, further comprising a first semiconductor chip having a latency counter supplied with the first command and configured to generate the second command,
    wherein the memory cell array and the active control circuit are integrated in a second semiconductor chip different from the first semiconductor chip.

16. The apparatus of claim 15, wherein the first and second semiconductor chips are stacked to each other.

17. The apparatus of claim 16, wherein the first and second commands are transferred from the first semiconductor chip to the second semiconductor chip via TSVs penetrating through at least one of the first and second semiconductor chips.

18. An apparatus comprising:
a latency counter supplied with a first command and configured to generate a second command when a predetermined period is elapsed after the first command is activated;
a first gate circuit configured to generate a first set signal in response to the first command when a state signal is in a first state;
a second gate circuit configured to generate a reset signal in response to the first command when the state signal is in a second state;
a SR latch circuit configured to be set by the first set signal to bring the state signal into the second state and be reset by the reset signal to bring the state signal into the first state; and
a FIFO circuit configured to store the reset signal in response to the first command and output the reset signal stored therein as a second set signal in response to the second command,
wherein the SR latch circuit is configured to be set by the second set signal to bring the state signal into the second state.

19. The apparatus of claim 18,
wherein the latency counter is configured to operate in synchronous with a clock signal, and
wherein the latency counter and the FIFO circuit are configured to be reset to an initial state when the clock signal is stopped.

20. The apparatus of claim 19, wherein the clock signal is stopped during a power down mode.

* * * * *